(12) United States Patent
Takahashi et al.

(10) Patent No.: US 8,139,388 B2
(45) Date of Patent: Mar. 20, 2012

(54) NONVOLATILE SEMICONDUCTOR STORAGE DEVICE

(75) Inventors: Mitsue Takahashi, Tsukuba (JP); Shigeki Sakai, Tsukuba (JP); Shouyu Wang, Tsukuba (JP); Ken Takeuchi, Yokohama (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 273 days.

(21) Appl. No.: 12/565,477

(22) Filed: Sep. 23, 2009

(65) Prior Publication Data
US 2010/0073988 A1    Mar. 25, 2010

(30) Foreign Application Priority Data

Sep. 24, 2008  (JP) ................. 2008-243614

(51) Int. Cl.
*G11C 11/22* (2006.01)
(52) U.S. Cl. ............. 365/145; 365/230.03; 365/51
(58) Field of Classification Search ............ 365/145, 365/230.03, 51, 185.29, 185.18, 185.17, 365/185.2, 185.03, 45, 218
See application file for complete search history.

(56) References Cited

U.S. PATENT DOCUMENTS

2003/0174532 A1* 9/2003 Matsushita et al. ............ 365/145
2007/0121376 A1* 5/2007 Toda .......................... 365/185.2

FOREIGN PATENT DOCUMENTS

| JP | 8-124378   | 5/1996  |
| JP | 2001-24163 | 1/2001  |
| JP | 2004-349310| 12/2004 |
| JP | 2006-108648| 4/2006  |

* cited by examiner

*Primary Examiner* — Dang Nguyen
(74) *Attorney, Agent, or Firm* — Oblon, Spivak, McClelland, Maier & Neustadt, L.L.P.

(57) ABSTRACT

This invention has the purpose of providing a nonvolatile semiconductor storage device which is capable of entering multivalued storage in a FeFET unit without requiring preparation of a plurality of voltage sources.

The nonvolatile semiconductor storage device is provided with multivalued ferroelectric memory cells which impart varied quantities of polarization to a ferroelectric material by applying pulse voltages having one and the same height and varied widths and consequently produce varied states of storage in conformity with the varied quantities of polarization.

5 Claims, 8 Drawing Sheets

NONVOLATILE SEMICONDUCTOR STORAGE DEVICE

TECHNICAL FIELD

This invention relates to a nonvolatile semiconductor storage device which possesses multivalued ferroelectric memory cells.

BACKGROUND ART

The dissemination of portable information devices in recent years has been spurring the needs for memory devices which are smaller and lighter and allow more saving of electric power and greater addition to capacity. As a large-capacity storage device promising to supersede the hard disk drive (HDD) which necessitates such a mechanical part as a motor, the solid state drive (SSD) using a NAND flash memory which is small, light, and capable of withstanding an external shock has been attracting attention. Though the NAND flash memory had a high unit cost in capacity as compared with the HDD magnetic disk, it has been enabled to penetrate the market rapidly by increasing the degree of integration of a memory array thereby lowering the unit cost in capacity.

To be specific, the NAND flash memory is formed of a memory array possessing a characteristic circuit configuration called a NAND type. The NAND flash memory has been developed progressively as a large-capacity memory because the degree of integration thereof can be augmented by compacting to the fullest possible extent the design layout of this memory array by the technology generation. The following two methods have been mainly adopted for the purpose of decreasing the unit cost in capacity by heightening the degree of integration of the memory array.

1) The first method consists in forming a memory device in a fine structure that allows the numbers of chips produced from one wafer to be increased.

2) In consideration of the fact that the storage in one memory cell is ordinarily made in one bit, namely that the judgment of the threshold voltage is made in the binary unit, the second method consists in decreasing the cost per bit by increasing the setting of the threshold value to the ternary unit or more.

The conventional memory cell, however, has about 10,000 rewritable cycles which are not a very large numbers, because this memory cell has been either a transistor possessing a floating gate capable of accumulating electric charge or a transistor possessing an insulating membrane capable of trapping electric charge.

It is said that when the fineness of structure is further pursued for the purpose of augmenting the degree of integration, the numbers of rewritable cycles will further decrease and the reliability of data will incur anxiety. Further since the conventional memory cell has been either a transistor possessing a floating gate capable of accumulating electric charge or a transistor possessing an insulating membrane capable of trapping electric charge, the voltage required for writing in the memory cell is about 20 V which is a large value. Thus, the conventional memory cell has entailed the problem that the electric current to be consumed is liable to be large because the low voltage supplied from the outside of the chip must be used after it has been heightened to about 20 V by the boosting circuit contained therein.

Then, when the fineness of structure of the conventional memory cell is further pursued, this fineness attained by the technique of production available after the so-called 30-nm generation is said to reach the limit owing to such problems as the leakage current between the floating gates of the adjacent memory cells and the capacity coupling noise. The formation of the NAND flash memory while using the conventional memory cell in the multivalued structure entails the problem that the writing and reading speeds will be decreased by the multistage decision of the threshold. Further, the conventional memory cell has entailed the problem that the increase of dispersion of the threshold voltages results in decreasing the difference between varied thresholds, rendering the discrimination of varied states of storage difficult, and further decreasing the numbers of writable cycles as a result.

As one method for solving the problems described above, the NAND-type random access memory of the binary memory and decision method using a ferroelectric gate transistor (FeFET) for a memory cell has been proposed (refer to Patent Document 1, for example). Since the ferroelectric materials generally have high prices and manifest widely varied solid state properties as compared with silicon, silicon oxide, and materials almost equivalent to silicon, the process for manufacturing the FeFET is liable to be complicated. When this state of affairs is taken into consideration, the introduction of the ferroelectric material into the NAND flash memory incurs another problem that the memory itself, while still resorting to the binary memory and decision method, is not feasible because the increase of cost per bit inevitably offsets the advantage of enhanced performance.

Meanwhile, the conventional technique concerning the device structure or storage method which is intended to subject the FeFET unit to multivalued storage has entailed the following problems.

As regards the device structure for subjecting the FeFET unit to the multivalued storage, for example, the semiconductor storage device which is vested with a multivalued nonvolatile storage by manufacturing a configuration which has memory function parts of a ferroelectric material attached to the side walls of a gate electrode has been proposed (refer to Patent Document 2, for example). In the case of the semiconductor storage device of this configuration, however, since the planar dimension of the memory function parts must be enlarged to the extent of enabling the multivalued nonvolatile storage to be discerned, there ensues the problem that, in the configuration of the transistor, particularly the layout area of the region of diffusion is enlarged and the degree of integration is lowered. As a method of storage for implementing the multivalued storage, the method which effects multivalued nonvolatile storage by a procedure that comprises manufacturing a configuration intentionally causing the gate electrode and the source area or drain area of FeFET to be piled up in the longitudinal direction and consequently inducing varied polarizations in the three parts composed of two ferroelectric bodies lying directly above two regions of diffusion and a ferroelectric material intervening therebetween has been proposed (refer to Patent Document 3, for example). In the case of this method, however, the fact that the three parts above-mentioned must be made to possess a mutually equal planar dimension gives rise to the problem that the layout area particularly of the gate area of the FeFET is enlarged and the degree of integration is lowered.

As the conventional storage device adapted for inducing multivalued storage in the FeFET unit, the ferroelectric memory that is enabled to acquire multivalued nonvolatile storage by interposing three voltages of varied magnitudes between the gate electrode and the substrate has been proposed (refer to Patent Document 4, for example). In the case of the memory so designed, since it is required to prepare many voltage sources, it incurs the problem that the numbers of circuits necessary for preparing a plurality of voltage sources inevitably increases.

Patent document 1: Japanese Unexamined Patent Publication No. 2001-24163

Patent document 2: Japanese Unexamined Patent Publication No. 2004-349310

Patent document 3: Japanese Unexamined Patent Publication No. 2006-108648

Patent document 4: Japanese Unexamined Patent Publication No. 8-124378/1996

DISCLOSURE OF THE INVENTION

Problem which the Invention Tries to Solve

This invention has the task of providing a nonvolatile semiconductor storage device that is capable of implementing multivalued storage in a FeFET unit without requiring preparation of a plurality of voltage sources.

Means for Solving the Problem

The task mentioned above is accomplished by such means that are enumerated below.

(1) The first aspect of this invention consists in a nonvolatile semiconductor storage device comprising a ferroelectric material and a means for applying voltage pulses having one and the same wave height and varied pulse widths, wherein the ferroelectric material possesses multivalued ferroelectric memory cells which are fed with quantities of polarization varied in conformity with the varied pulse widths of the voltage pulse and enabled to produce the states of storage varied in conformity with the variation in the polarization quantity.

(2) The second aspect of this invention consists in a nonvolatile semiconductor storage device set forth in the first aspect of this invention, possessing a plurality of multivalued ferroelectric memory cells and provided with a means for selecting at least one multivalued ferroelectric memory cell from among the plurality of multivalued ferroelectric memory cells, wherein the means for applying the voltage pulses applies one voltage pulse to the selected multivalued ferroelectric memory cell and the selected multivalued ferroelectric memory cell produces states of storage varied by the variation of the pulse width of the voltage pulse to be applied.

(3) The third aspect of this invention consists in a nonvolatile semiconductor storage device set forth in the first aspect of this invention, wherein two or more voltage pulses are applied to the selected multivalued ferroelectric memory cell and the states of storage varied by the variation in the numbers of voltage pulses to be applied are produced.

(4) The fourth aspect of this invention consists in a nonvolatile semiconductor storage device set forth in the first aspect of this invention, wherein one of the voltage pulses applied to the multivalued ferroelectric memory cells is used for coarse adjustment capable of largely varying the threshold voltages of the memory cells, the rest of the voltage pulses are used for fine adjustment capable of finely varying the threshold voltages of the memory cells, and the states of storage in the memory cells are produced by causing the threshold voltages of the memory cells to be moved bit by bit till they reach the threshold voltages equivalent to the expected states of storage by the application of the pulses for the fine adjustment after the threshold voltages of the memory cells have been moved in close proximity to the threshold voltages equivalent to the expected states of storage by the application of the pulses for the coarse adjustment.

(5) The fifth aspect of this invention consists in a nonvolatile semiconductor storage device set forth in any of the first to fourth aspects of this invention, wherein the multivalued ferroelectric memory cells are formed of a ferroelectric gate transistor having a ferroelectric material contained in a gate insulating film between the gate electrode and the semiconductor substrate of the transistor, the NAND cells having a plurality of the multivalued ferroelectric memory cells disposed in series connection thereto are arrayed in a matrix and the drains on one terminal side of the NAND cells are connected to the bit lines, and the gates of the individual multivalued ferroelectric memory cells are formed of a memory array connected to one of the word lines.

(6) The sixth aspect of this invention consists in a nonvolatile semiconductor storage device set forth in the fifth aspect of this invention, wherein the memory array is divided into a plurality of blocks and configured so as to enable the individual blocks to be erased independently.

Effects of the Invention

This invention enables production of a nonvolatile semiconductor storage device which is capable of effecting multivalued storage in respective FeFET devices without requiring preparation of a plurality of voltage sources.

BRIEF DESCRIPTION OF THE DRAWINGS

FIG. 1C is a hysteresis loop which delineates the electrical characteristics of the logarithmically displayed electric current between the drain terminal 15a and the source terminal 12a vs. the electric potential difference between the gate terminal 13a and the substrate terminal 11a.

BEST MODE OF CARRYING OUT THE INVENTION

Figure 1A:
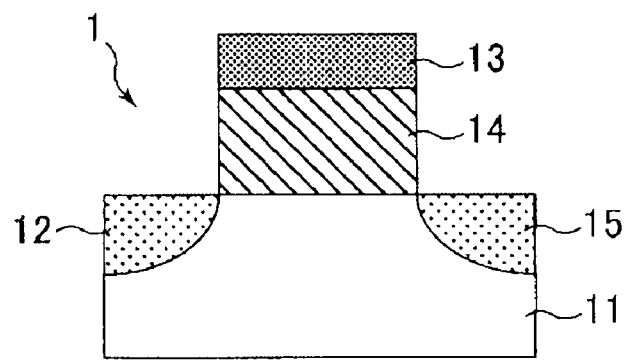
FIG. 1A is a schematic diagram of the configuration of a FeFET 1.

Prior to explaining the details of a nonvolatile semiconductor storage device involved in one example of this invention, the FeFET that is used in the memory cell of this nonvolatile semiconductor storage device will be summarily explained. The FeFET 1 possesses an insulator containing a ferroelectric material 14 between the gate electrode 13 and the substrate of a transistor (FIG. 1A). The FeFETs existing currently are classified under two types, i.e. the n-channel type and the p-channel type. The equivalent circuit of the FeFET of the n-channel type, for example, can be shown by such a type diagram as one appearing in FIG. 1B.

Though the FeFET of the n-channel type will be explained hereinbelow, the FeFET of the p-channel type can be operated in entirely the same manner in accordance with this explanation by suitably changing the positive-negative signs of the applied voltages. By varying the voltage applied between the gate terminal 13a and the substrate terminal 11a of the FeFET 1, the electric current Ids flowing between the drain terminal 15a and the source terminal 12a can be controlled. The polarization quantity and the positive-negative status of the ferroelectric material are varied in accordance with the magnitude and direction of the voltage applied between the gate and substrate terminals and, as a result, the threshold voltage of the FeFET is varied. When the electric potential of the gate terminal relative 13a to the substrate terminal 11a is symbolized by using Vgsub, in the case that the difference between the largest value VgH and the smallest value VgL of Vgsub is sufficiently large, the electrical characteristics of Ids vs. Vgsub are graphed by such a hysteresis loop of the shape and direction that is shown in FIG. 1C.

Now, the modes of embodiment of this invention will be explained in detail below.

First Embodiment

Figure 2A:
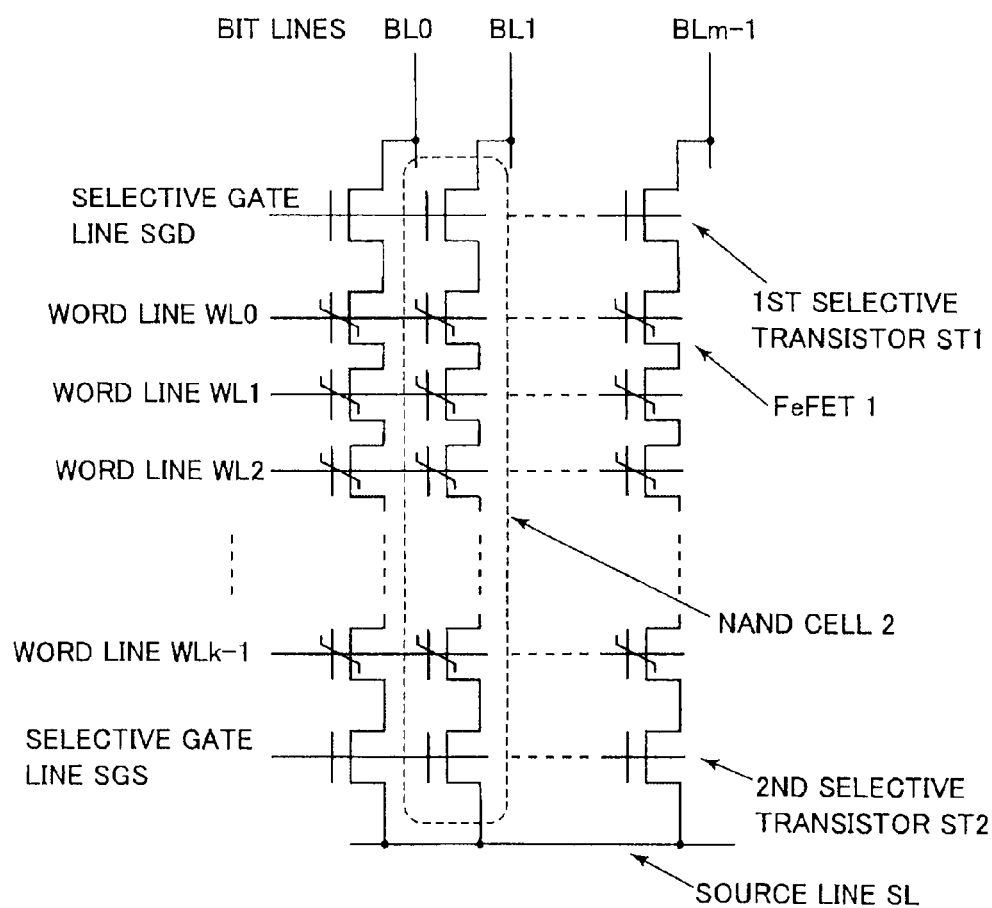
FIG. 2A is a circuit diagram of the basic part of the memory array of multivalued NAND flash memories involved in the typical mode of the embodiments of this invention and FIG. 2B is a circuit diagram of the multivalued NAND flash memory which is the typical mode of the embodiments of this invention.

FIG. 2A illustrates the basic part circuit of the memory array of multivalued NAND flash memories involved in the typical mode of the embodiments of this invention. FIG. 2A illustrates the basic part circuit in one block of a memory array of NAND flash memories using the FeFET for a memory cell and the basic part circuit has the following characteristics. First, in the circuit of FIG. 2A, by causing one memory cell and another memory cell to share a region of a source 12 or a region of a drain 15 through a source line SL, the NAND cell 2 having a plurality of memory cells joined in series connection and the $1^{st}$ and $2^{nd}$ selective transistors (ST1, ST2) disposed each at opposite ends is formed. That is, the memory array which has the NAND cell 2 arranged neatly in direction (longitudinal in the layout of FIG. 2A) and disposed regularly in the form of a matrix is formed. Further, a plurality (denoted by k) of word lines WL are disposed on the memory array in the direction intersecting the above-mentioned NAND cell 2, the gate terminal 13a of the memory cell is connected to one of the word lines WL0~WLk−1, and a plurality (denoted by m) of bit lines BL are disposed on the memory array in the direction intersecting the above-mentioned word lines WL0~WLk−1. The terminals on one side of the NAND cell 2 are connected to bit lines BL0~BLm−1 and the terminals on the other side of the NAND cells are connected to the source line SL. Incidentally, the "the $1^{st}$ and $2^{nd}$ selective transistors ST1 and ST2" shown in FIG. 2A function as a means for selecting at least one multivalued ferroelectric memory cell from the plurality of multivalued ferroelectric memory cells which form the circuit of FIG. 2A. The drain of the selective transistor ST1 is connected to one of the bit lines BL0~BLm−1 and the source of the selective transistor ST2 is connected to the source line SL in common with the source of the selective transistor ST1. And, the gates of the transistors ST1 and ST2 are respectively connected to the selective gate lines SGD and SGS.

Figure 2B:
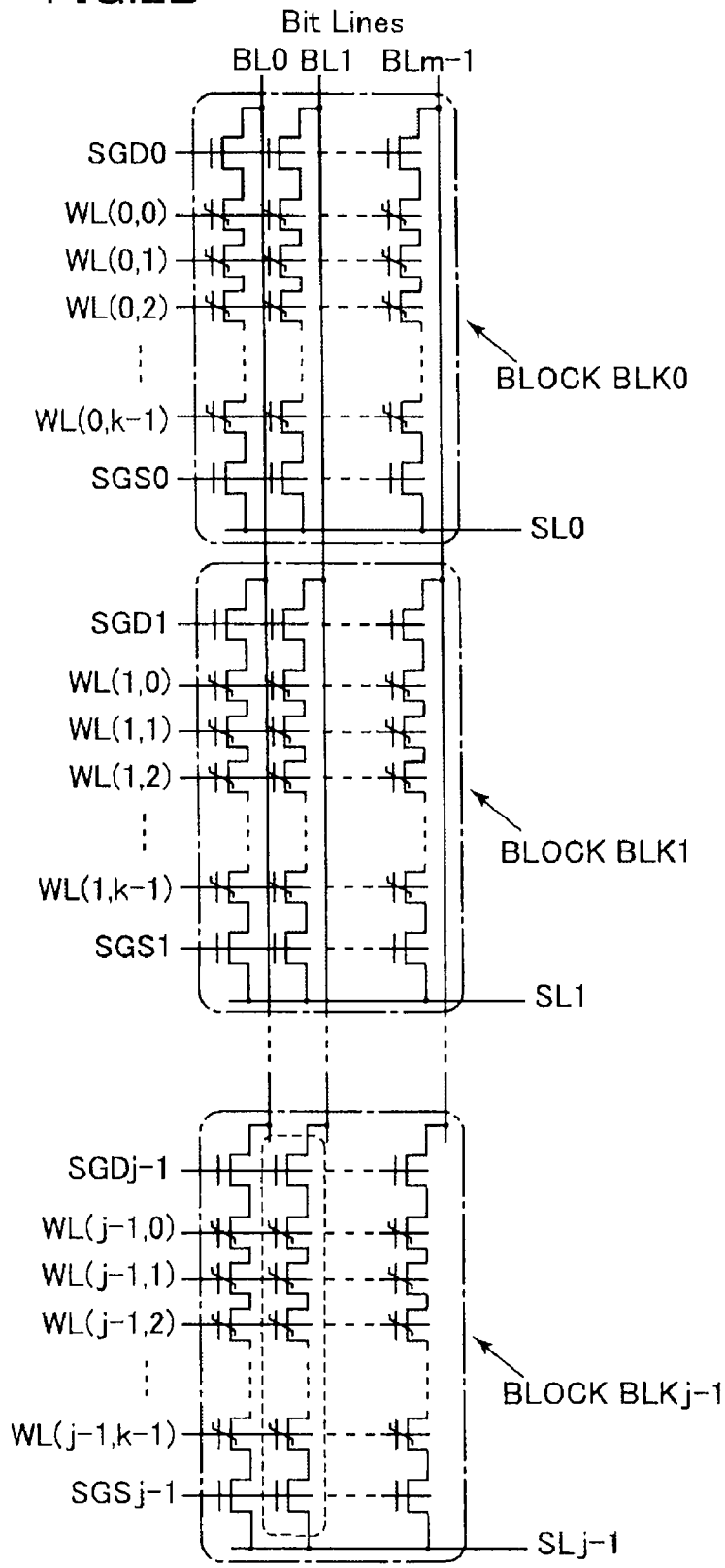

The typical mode of the embodiments of this invention consists in a multivalued NAND flash memory which possesses such a circuit that is shown in FIG. 2A as the basic part of the memory array, uses the FeFET as the multivalued ferroelectric memory cell, and imparts multivalued storage to the memory cell. The nonvolatile semiconductor storage device of this invention is naturally capable of performing such actions peculiar to the NAND flash memory as using a plurality of memory cells sharing one word line as one unit, writing or reading the memory of the respective units, and causing all the memory cells belonging to one of the word lines or a plurality of the word lines to assume the state of erasure collectively. The typical mode of the embodiments of this invention is composed of the circuit of FIG. 2A which is one block. That is, as shown in FIG. 2B, the typical mode of the embodiments of this invention consists of the iterative array of the circuit of FIG. 2A which is the repeated connection of the circuits from the block BLK0 to the block BLKj−1. Among the blocks from BLK0 to BLKj−1, the respective block BLKn (n is an integer number between 0 and j−1) has the bit lines from BL0 to BLm−1 in common. Indication symbols "SGD 0", "SGD 1" . . . "SGD j−1" respectively denote each of selective gate lines which the blocks BLK0~BLKj−1 respectively include in FIG. 2B. In the same way as mentioned above, symbols "SGS 0"~"SGS j−1" respectively denote selective gate lines of the blocks BLK0~BLKj−1. And symbols "WL(n, 0)", "WL(n, 1)", "WL(n, 2)" . . . "WL(n, k−1)" (n is an integer number between 0 and j−1) denote word lines which each of the blocks BLK0~BLKj−1 is composed of. And symbols "SL0", "SL1" . . . "SLj−1" respectively denote source lines which each of the blocks BLK0~BLKj−1 has. The structure mentioned above of this invention can actualize a high-capacity multivalued NAND flash memory.

Since the FeFET is operated by the method of effecting storage by inverting the polarization of a ferroelectric material, it allows the writing voltage to be lowered below 6 V in consequence of forming the memory cells in a very small size. Thus, the multivalued NAND flash memory of this invention enables the boosting circuit to lower its electric power consumption and allows the rewriting operation to be repeated up to about 100,000,000 or more cycles. Further, for the reason that no capacity-coupled noise is generated between the adjacent memory cells because of the absence of a floating gate from the FeFET, the multivalued NAND flash memory of this invention can cope with the 20 nm and 10 nm technology generations after the 30 nm technology generation. The multivalued NAND flash memory of this invention, as compared with the conventional countertype, derives from using the FeFET as the multivalued ferroelectric memory cell as the above-described advantage that the operating voltage can be decreased, the rewriting durability can be enhanced, and the bit density can be heightened by further promoting the fine size reduction of the size of the multivated NAND flash memory.

Figure 3:
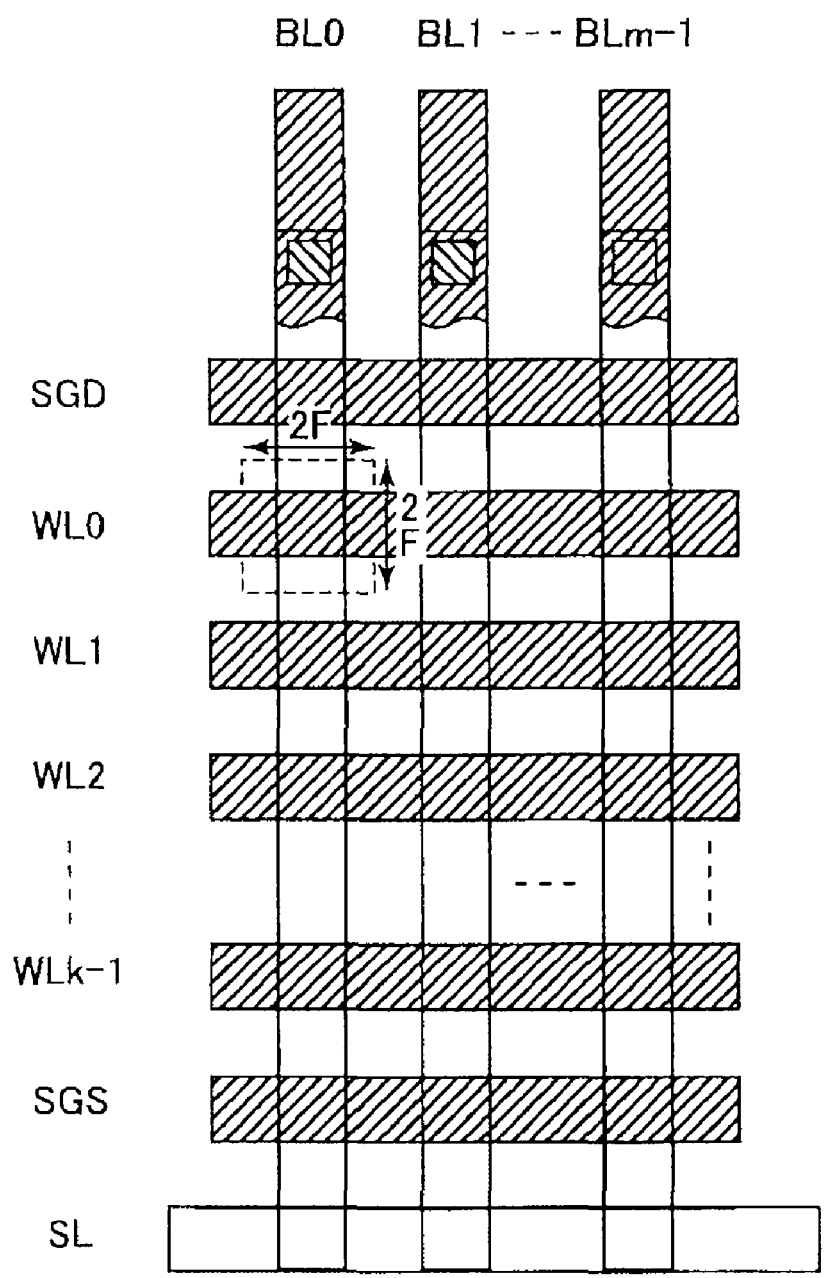
FIG. 3 is a preferred layout drawing of the basic part circuit of a memory array of multivalued NAND flash memories using the FeFET which is the typical mode of embodiment of the nonvolatile semiconductor storage device of this invention as a multivalued ferroelectric memory cell.

The desirable layout of the basic part circuit of the typical mode of the embodiments of the nonvolatile semiconductor storage device of this invention, namely the memory array of multivalued NAND flash memories using the FeFET as a memory cell, is shown in FIG. 3. The individual memory cell forming this circuit can be formed in the smallest processing size F that characterizes the technology generation of semiconductor devices and can be formed so as to occupy a planar dimension of $2F \times 2F = 4F^2$. That is, the multivalued NAND flash memory of this invention possesses the advantage that the degree of integration can be heightened. The nonvolatile semiconductor storage device of this invention obviates the necessity of attaching a memory function part made of a ferroelectric material to the side wall of a gate electrode and the necessity of intentionally causing the gate electrode and the source area or drain area to be piled up in the longitudinal direction.

As means for enabling the memory cell to fulfill multivalued storage by imparting a voltage pulse having a wave height (hereinafter referred to otherwise as "pulse height") as the magnitude of voltage and a pulse width as the duration of application to the word lines, the following methods may be cited:

(1) A method which imparts a threshold varied by the variation in pulse height.

(2) A method which imparts a threshold varied by the variation in pulse width.

(3) A method which comprises repeating the application of a voltage pulse of a fixed wave form and imparting a threshold varied by the variation in number of applications.

(4) A method which imparts a voltage pulse resulting from combining a voltage pulse for coarse adjust having a large pulse height or a long pulse width and a voltage pulse for fine adjustment having a small pulse height or a short pulse width as compared with the voltage pulse for the coarse adjustment: namely a method which comprises causing the threshold voltage of the memory cell to be moved in close proximity to the expected threshold by the application of the voltage pulse for coarse adjustment and thereafter causing the voltage to be moved bit by bit till it reaches the threshold voltage equivalent to the expected state of storage by the application of the voltage pulse for fine adjustment.

The characteristics, advantages, etc. of the methods enumerated in (1) to (4) above will be described below:

(1) The method which imparts a threshold varied by the variation in pulse height is capable of accelerating the writing speed by increasing the pulse height even when the pulse width is maintained. This method, however, entails the problem that it necessitates preparation of many voltage sources and suffers the numbers of circuits required for the preparation of the plurality of voltage sources to increase.

(2) The method which imparts a threshold varied by the variation in pulse width is capable of imparting a plurality of thresholds by using one and the same voltage and, therefore, is capable of repressing the numbers of power source voltage generating circuits to be prepared and the planar dimension of the layout necessary for the application of voltage pulse to the lowest possible limits. Further, since this method dispenses with the use of high voltage, it obviates the necessity of increasing the layout area for a high withstanding pressure transistor and allows the chip area to be reduced. Where the smallness of the chip area is preferred to the greatness of the data rewriting speed, the present invention finds this method particularly effective.

(3) The method which comprises repeating the application of a voltage pulse of a fixed wave form and imparting a threshold varied by the variation in number of applications is enabled to write the storage additionally in small steps by adjusting the numbers of applications of the voltage pulse of one and the same form having a small pulse width per pulse. Thus, this method is capable of controlling the threshold and proves to be particularly effective for this invention where the dispersion of thresholds between memory cells is required to be repressed. Incidentally, the time of application expressed as the multiplication "width of one pulse×the numbers of the pulses", namely the effective time of application, can be regarded as the time of application of one pulse which is applied in continuity during a given length of time. Then, the wave height of the voltage pulse that is imparted to the gate terminal when the substrate terminal is set at 0 V is preferably 3V~9V during the course of writing information for storage and −3V~−9V during the course of erasing the information in storage. The pulse width is preferably 1 s~10 ns. During the course of erasing the information in storage, a positive voltage can be imparted to the substrate terminal by setting the gate terminal at 0 V. When the gate terminal is set at 0 V, the wave height of the voltage pulse applied during the course of erasing the information in storage is preferably 3V~9V and the pulse width is preferably 1 s~10 ns. Though the pulse wave may be in any form so long as the wave height is maintained, the "sine wave," "square wave," "triangular wave," and "saw-tooth wave" prove to be preferably because the means for generating these wave forms is simple. The square wave proves to be particularly preferable because the wave form thereof can be easily generated in a semiconductor integrated circuit.

(4) The method which comprises imparting a voltage pulse formed by combining a voltage pulse for coarse adjustment and a voltage pulse for fine adjustment and moving the voltage to the threshold voltage equivalent to the expected state of storage is capable of repressing the decrease of the numbers of rewritable cycles and accelerating the writing speed. Thus, the present invention finds this method particularly effective when the method involves a consideration of the generous voltage pulse conditions for obtaining an expected threshold.

The above-mentioned method (2) that imparts multivalued storage to a memory cell will be briefly explained. The information for storage is written and erased by applying a voltage pulse possessing one and the same pulse height and a varied pulse width to the FeFET. The threshold voltage can be varied by varying the pulse width while one and the same pulse height is maintained. The more the pulse width increases, the wider the difference of the threshold voltage between the state of writing and the state of erasing the information for storage grows and so discriminating multiple values becomes easier.

Figure 1B:
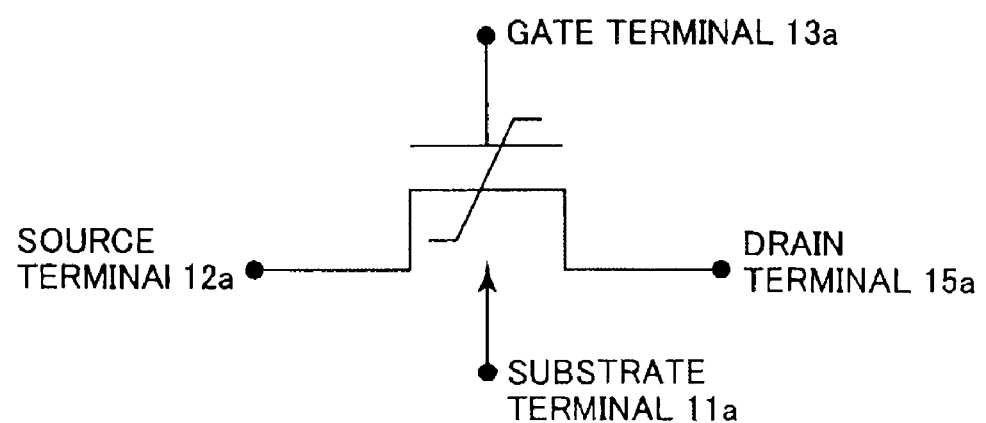
FIG. 1B is an equivalent circuit diagram of the FeFET 1.
Figure 1C:
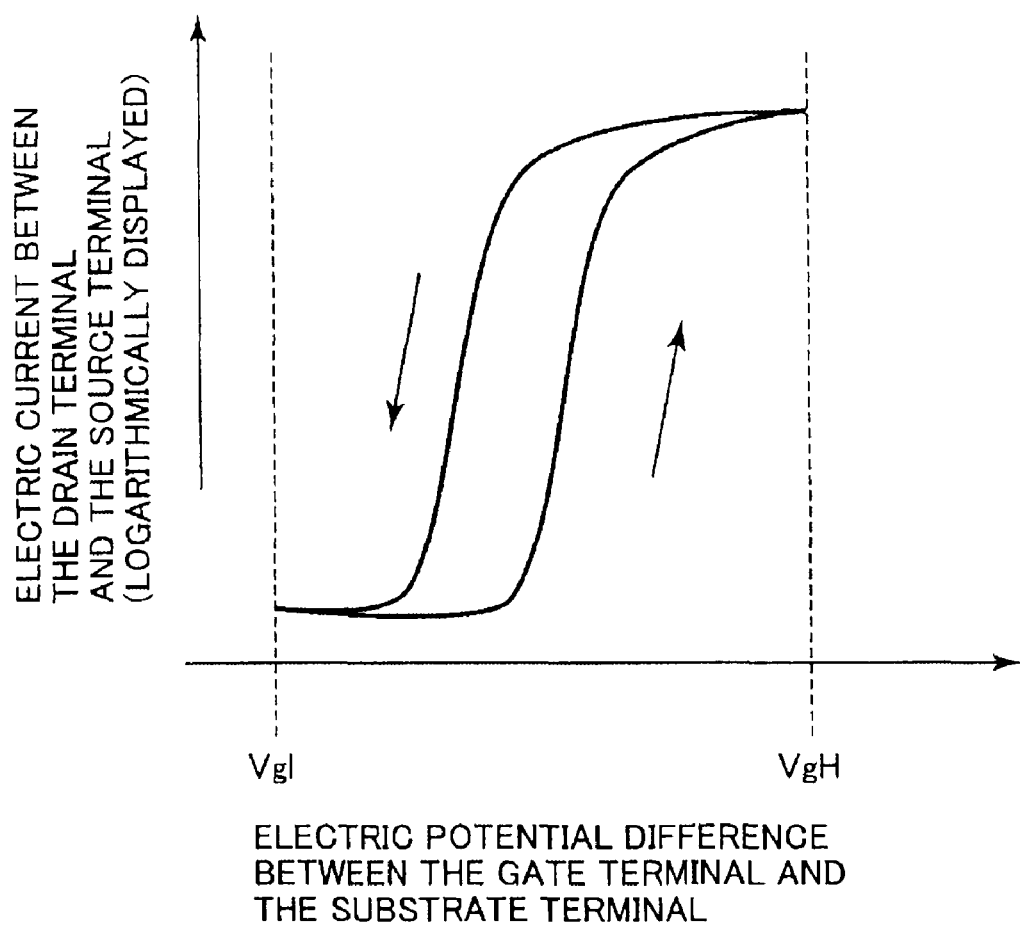
Figure 4:
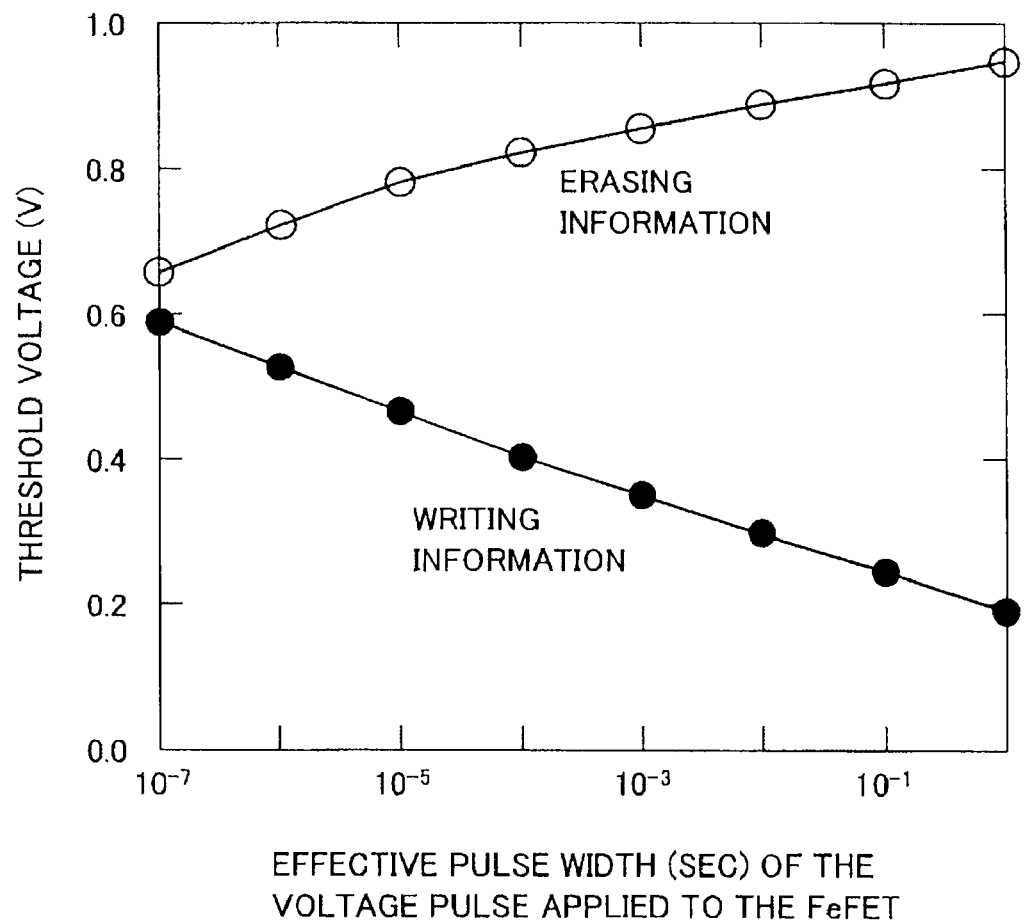
FIG. 4 is a drawing showing an experimental example of Method (2) for imparting multivalued storage to the FeFET 1 of the configuration of FIG. 1A.

As an experimental example of the above-mentioned method (2) that imparts multivalued storage to the memory cell, the relation of the threshold voltage to the pulse height of the voltage pulse applied to the FeFET of the configuration of FIGS. 1A and 1B was studied. The results of this experiment were as shown in FIG. 4. The information for storage was written and erased by applying a voltage pulse having one and the same pulse height and a varied pulse width to the FeFET 1 of the configuration of FIGS. 1A and 1B. The threshold was read out by applying a voltage so small as to avoid rewriting the stored information to the gate terminal after the writing operation. Also, the threshold was read out by applying a voltage so small as to avoid rewriting the stored information to the gate terminal after the erasing operation. Incidentally, the FeFET used in this experiment had a gate length of L=7 μm and a gate width of W=50 μm and possessed the configuration of a gate lamination formed of the metal-ferroelectric-insulator-semiconductor layers having a composition of Pt/SrBi$_2$Ta$_2$O$_9$/(HfO$_2$)$_x$(Al$_2$O$_3$)$_{1-x}$/Si(hereinafter abbreviated as "Pt/SBT/Hf—Al—O/Si"). The voltage of 0 V was applied to the substrate terminal 11a. A pulse of +5 V was imparted during the course of writing the information for storage and a pulse of −5 V was imparted during the course of erasing the information in storage. In the operation of reading out the threshold voltage, a voltage of 0.1 V was imparted to the drain terminal 15a and a voltage of 0 V to the source terminal 12a, the small voltage imparted to the gate terminal 13a was swept from 0 V to 1.2 V, and the gate terminal voltage that induced a drain current of 1 μA was taken as the threshold voltage. The results of the experiment in FIG. 4 indicate that the threshold voltage can be varied by varying the pulse widths for writing and erasing even if one and the same pulse is maintained. Incidentally, even when a pulse of 0 V is imparted to the gate terminal 13a and a pulse of +5 V is imparted to the substrate terminal 11a, the operation of erasing through this method equals the operation of erasing through the method of above-mentioned (2) shown in FIG. 4.

In the present mode of embodiment, even if the memory cells having one and the same performance are used, it is possible to fluctuate flexibly in conformity with the specifications of the chip the numbers of the cases where a circuit for discrimination of the multivalued storage can determine the threshold. Specifically, when the overall performance of the chip allows the writing speed to be slow or the numbers of rewritable cycles to be small, the numbers of cases of deciding the threshold is increased by increasing the numbers of states of writing to be stored in the memory cell. On the other hand, when the writing speed is required to be high or the numbers of rewritable cycles to be large, the numbers of cases of deciding the threshold can be decreased by decreasing the numbers of states of writing to be stored in the memory cell.

According to this invention, either the choice between increasing the numbers of steps of circuits for decision of the threshold in favor of lowering the bit cost of the chip or decreasing the numbers of steps of circuits for decision of the threshold in favor of maintaining high-speed writable and rewritable cycles can be made and one chip can suffice for diverse needs.

Second Embodiment

Another mode of embodiment of this invention consists in a semiconductor nonvolatile memory using the FeFET as a memory cell and possessing the following characteristics. It is enabled to impart different quantities of polarization to a ferroelectric by applying at least three kinds of voltage pulses differing in the effective pulse width which is expressed by multiplying the pulse width by the numbers of continuous pulse applications between the gate electrode and the semiconductor substrate of the FeFET. It is further characterized by comprising a means for effecting multivalued decision of at least three kinds of threshold voltages in conformity with the difference in the quantity of polarization and also minimizing the overlap of the gate electrode and the source or drain region in the range which allows the transistor to be operated. The semiconductor nonvolatile memory which constitutes the second mode of embodiment is not limited to the multivalued NAND flash memory.

The second embodiment will be explained with reference to FIG. 5 and FIG. 6.

An experiment of imparting a total of five states of storage, namely four states of writing and one state of erasing, to the FeFET and reading out five threshold voltages corresponding to these states of storage was carried out. The FeFET used in the experiment had a gate length of L=7 μm and a gate width of W=50 μm and possessed a gate lamination structure which was formed of "metal/ferroelectric/insulator/semiconductor" structure of Pt/SBT/Hf—Al—O/Si.

As the conditions for application of voltage, a voltage of 0 V was applied to each of the terminals of source, drain, and substrate, a voltage of +6 V was applied to the gate terminal during the course of writing and a voltage of −6 V was applied to the gate terminal during the course of erasing. And then, the durations of application of these voltages were varied. The durations of application of voltage were respectively 100 μs for the operation of erasing, 0.1 μs for that of writing (P1), 1.5 μs for that of writing (P2), 25 μs for that of writing (P3), and 3 ms for that of writing (P4).

Figure 5:
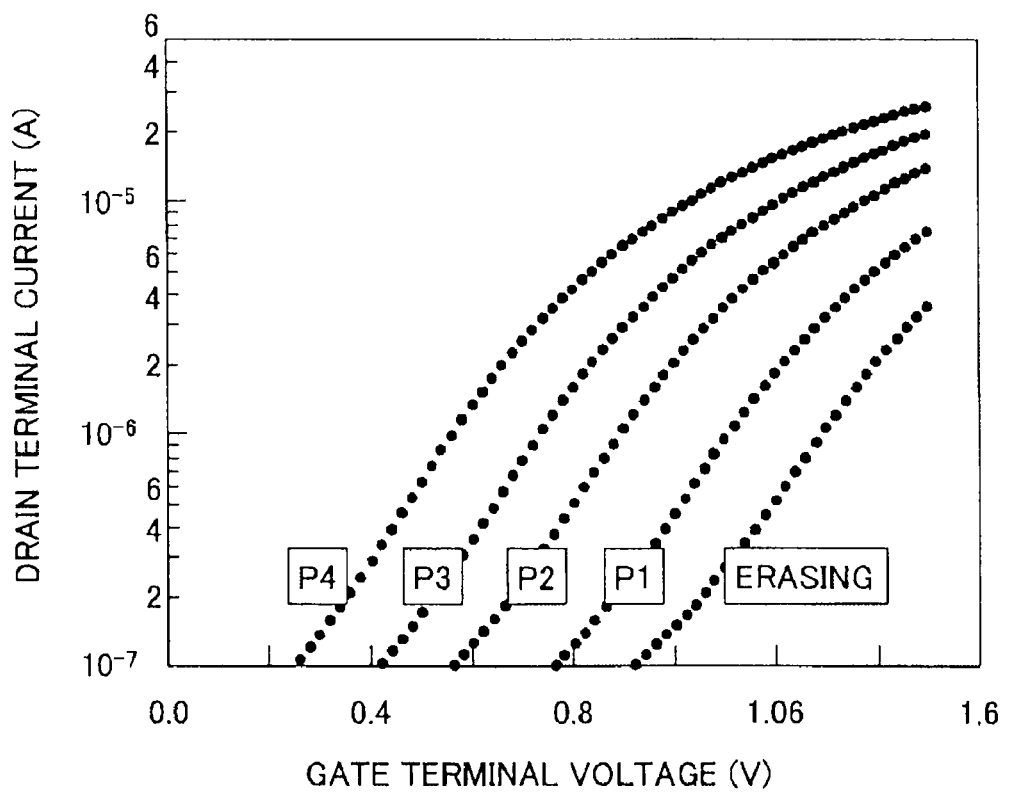
FIG. 5 is a drawing showing an experimental example which comprises imparting a total of five states of storage, i.e., four states of writing and one state of erasing, to the FeFET and reading out five threshold voltages corresponding to these states of storage.
Figure 6:
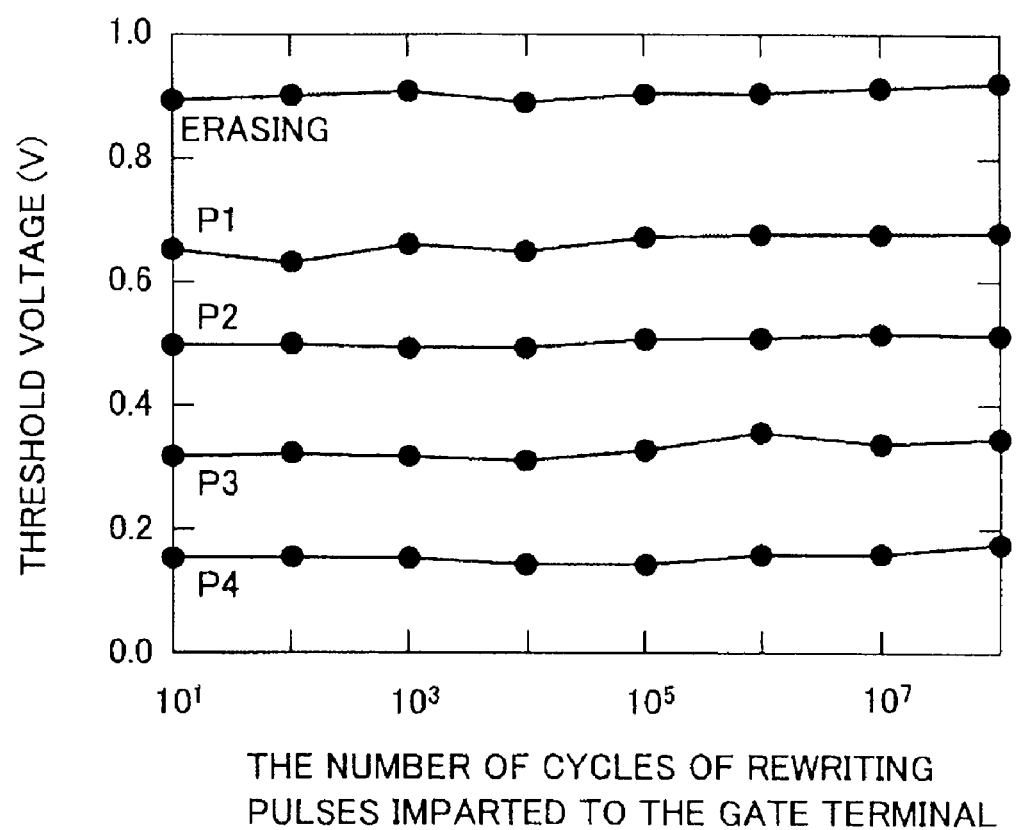
FIG. 6 is a drawing showing an experimental example which comprises imparting a total of five states of storage, i.e., four states of writing and one state of erasing, to the FeFET and reading out five threshold voltages corresponding to these states of storage after rewriting pulses have been given in a total of 100,000,000 cycles to the FeFET.

The characteristic curve of the drain terminal current vs. the gate terminal voltage that was obtained by applying, for the sake of reading, a voltage so small as to avoid rewriting the storage to the gate terminal after each of the operations of writing (P~P4) and erasing is shown in FIG. 5. A voltage of 0.1 V was imparted to the drain terminal and a voltage of 0 V to the source terminal and the small voltage imparted to the gate terminal was swept from 0 V to 1.2 V. The ordinate axis of FIG. 5 is graduated in a logarithmic scale. FIG. 5 indicates that five states of storage were imparted to the FeFET by the operations of writing P1~P4 and erasing and that they could be discriminated by the operation of reading.

While the voltages imparted to the terminals of source, drain, and substrate of the FeFET were each fixed at 0 V, a rewriting pulse having a pulse height of ±6 V and a pulse width of 2 μs per cycle was imparted to the gate terminal up to 100,000,000 ($10^8$) cycles. When it came at the $10^n$ th (n=1, 2, 3, . . . 8) cycle of the rewriting pulses, the operations of writing (P1~P4) and erasing and the operations of reading (the operations of obtaining the characteristic curve of the drain terminal current vs. the gate terminal voltage by applying to the gate terminal a voltage so small as to avoid rewriting the storage) were carried out to read out the threshold voltages of the five states. Incidentally, the threshold voltage is defined as the voltage of the gate terminal that exists when the drain current is 1 μA. The results of this determination were as shown in FIG. 6. FIG. 6 indicates that even when the rewriting stress is exerted up to 100,000,000 cycles, the change of the threshold voltage of the FeFET is very small and the threshold voltages of the five states can be thoroughly discriminated. This fact indicates that the second mode of embodiment possesses excellent resistance to rewriting pulses.

The second mode of embodiment, even in the case of requiring only two gate terminal voltages, ±6 V, for rewriting, possesses the advantage of enabling the FeFET to effect multivalued storage and repressing the numbers of power source voltage generating circuits to be prepared and the layout area necessary for these circuits to be the smallest possible limits.

The multistage state of storage that shows up as the multistage threshold voltage of the FeFET which is used for the nonvolatile semiconductor storage device of this invention can be wholly on the basis of the state of non-saturated polarization of a ferroelectric material. Incidentally, the expression "the state of non-saturated polarization of a ferroelectric material" means the state of a process in which a minute lump called "a polarizing domain" and possessing giant electricity expands in consequence of the elapse of time and the increase of gate voltage and eventually reaches saturated polarization.

Since the FeFET possesses a thorough data retaining property, the polarization of the ferroelectric material is not always required to be in the state of saturation. On the contrary, the application of a voltage which is so large that the polarization of the ferroelectric material reaches the state of saturation incurs the risk of inducing the phenomenon of electric charge injection and deteriorating the data retaining property of the FeFET or triggering the destruction of the device itself. Thus, the repression of the multistage applied voltage to the extent of imparting the state of non-saturated polarization to the ferroelectric material during the course of entering the multivalued storage in the FeFET has the advantage of keeping the data reliability of the device in a good condition. It also has the advantage that the problem of increasing the layout area for the sake of the transistor of high withstanding pressure is eliminated because the use of high voltage is not required.

What is claimed is:

1. A nonvolatile semiconductor storage device comprising:
   a ferroelectric material; and
   a means for applying voltage pulses having a same wave height and varied pulse widths, wherein
   the ferroelectric material possesses multivalued ferroelectric memory cells which are fed with quantities of polarization varied in conformity with the varied pulse widths of the voltage pulses and enabled to produce states of storage varied in conformity with the variation in the polarization quantity,
   one of the voltage pulses applied to the multivalued ferroelectric memory cells is used for coarse adjustment capable of largely varying threshold voltages of the memory cells, the rest of the voltage pulses are used for fine adjustment capable of finely varying the threshold voltages of the memory cells, and
   the states of storage in the memory cells are produced by causing the threshold voltages of the memory cells to be moved bit by bit till they reach threshold voltages equivalent to the expected states of storage by the application of the pulses for the fine adjustment after the threshold voltages of the memory cells have been moved in close proximity to the threshold voltages equivalent to the expected states of storage by the application of the pulses for the coarse adjustment.

2. The nonvolatile semiconductor storage device according to claim 1, possessing a plurality of multivalued ferroelectric memory cells and provided with a means for selecting at least one multivalued ferroelectric memory cell from among the plurality of multivalued ferroelectric memory cells, wherein the means for applying the voltage pulses applies one voltage pulse to the selected multivalued ferroelectric memory cell, and
   the selected multivalued ferroelectric memory cell produces states of storage varied by the variation of the pulse width of the voltage pulse to be applied.

3. The nonvolatile semiconductor storage device according to claim 1,
   wherein no less than two voltage pulses are applied to a selected multivalued ferroelectric memory cell and the states of storage varied by the variation in the number of voltage pulses to be applied are produced.

4. The nonvolatile semiconductor storage device according to any of claims 1 to 3,
   wherein the multivalued ferroelectric memory cells are formed of a ferroelectric gate transistor having a ferroelectric material contained in a gate insulating film between a gate electrode and a semiconductor substrate of the transistor,
   NAND cells having a plurality of multivalued ferroelectric memory cells disposed in series connection thereto are arrayed in a matrix and drains on one terminal side of the NAND cells are connected to bit lines, and
   the gates of the individual multivalued ferroelectric memory cells are formed of a memory array connected to one of a plurality of word lines.

5. The nonvolatile semiconductor storage device according to claim 4,
   wherein the memory array is divided into a plurality of blocks and configured so as to enable the blocks to be erased independently.

* * * * *